United States Patent [19]

Safai et al.

[11] Patent Number: 5,572,066

[45] Date of Patent: Nov. 5, 1996

[54] LEAD-ON-CHIP SEMICONDUCTOR DEVICE AND METHOD FOR ITS FABRICATION

[75] Inventors: Sohrab Safai, Round Rock; Michael C. Przano, Pflugerville, both of Tex.

[73] Assignee: Motorola Inc., Schaumburg, Ill.

[21] Appl. No.: 368,506

[22] Filed: Jan. 3, 1995

[51] Int. Cl.$^6$ .................................. H01L 23/495
[52] U.S. Cl. ............... 257/666; 257/676; 257/696
[58] Field of Search .......................... 257/666, 676, 257/696; 174/52.2

[56] References Cited

U.S. PATENT DOCUMENTS

| | | | |
|---|---|---|---|
| 5,068,712 | 11/1991 | Murakami et al. | 257/696 |
| 5,072,280 | 12/1991 | Matsukura | 357/70 |
| 5,206,536 | 4/1993 | Lim | 257/668 |
| 5,357,139 | 10/1994 | Yaguchi et al. | 257/666 |
| 5,406,028 | 4/1995 | Beng et al. | 257/696 |

Primary Examiner—Mahshid Saadat
Assistant Examiner—Roy Potter
Attorney, Agent, or Firm—Minh-Hien Clark

[57] ABSTRACT

A lead-on-chip (LOC) device (44) has a comb-shaped (32) or a cut-out (38) tape as the means of attachment for the leads (14) to the die surface. The LOC tape has cut-outs between the leads to minimize the amount of tape between the leads. The cut-outs are provided by either making the tape comb-shaped so that it has teeth and gaps between each tooth or by having oblong-shaped cut-outs in the tape corresponding in location the gaps between the leads. By minimizing the tape to die interface between the leads, the chance of voids forming between the leads is eliminated.

14 Claims, 2 Drawing Sheets

LEAD-ON-CHIP SEMICONDUCTOR DEVICE AND METHOD FOR ITS FABRICATION

FIELD OF THE INVENTION

The present invention relates generally to a semiconductor device, and more specifically to a lead-on-chip semiconductor device and methods for its fabrication.

BACKGROUND OF THE INVENTION

Lead-on-chip (LOC) semiconductor devices have gained widespread acceptance in the semiconductor industry, particularly in the area of semiconductor memories. As illustrated in FIG. 1, an LOC device 10 has leads 14 attached directly above an active surface of a semiconductor die 12 by means of an LOC tape 16. Tape 16 is a solid strip of nonconductive adhesive material whose main purpose is to secure the leads to the die prior to the step of forming the wire bonds 20 which electrically connect the leads 14 to bonding pads 18 on the die surface. In FIG. 1, the bonding pads are shown to be located along the periphery of the die. However, memory devices also include designs having bonding pads along the centerline of the die.

There is a voiding problem with conventional LOC devices. The voids or air bubbles are often formed between the LOC tape and the die surface in the areas between the leads 14 during the attachment of the leads to the die via the LOC tape. As a result of the presence of the voids, moisture absorbed from the ambient collects in these voids which then causes reliability problems for the device. The presence of moisture is detrimental to metallization on the semiconductor die by causing corrosion of the metal lines. Moisture can also cause delamination between the die and the tape when the device is at elevated temperatures, which can affect the integrity of the device.

DETAILED DESCRIPTION OF A PREFERRED EMBODIMENT

Figure 1:
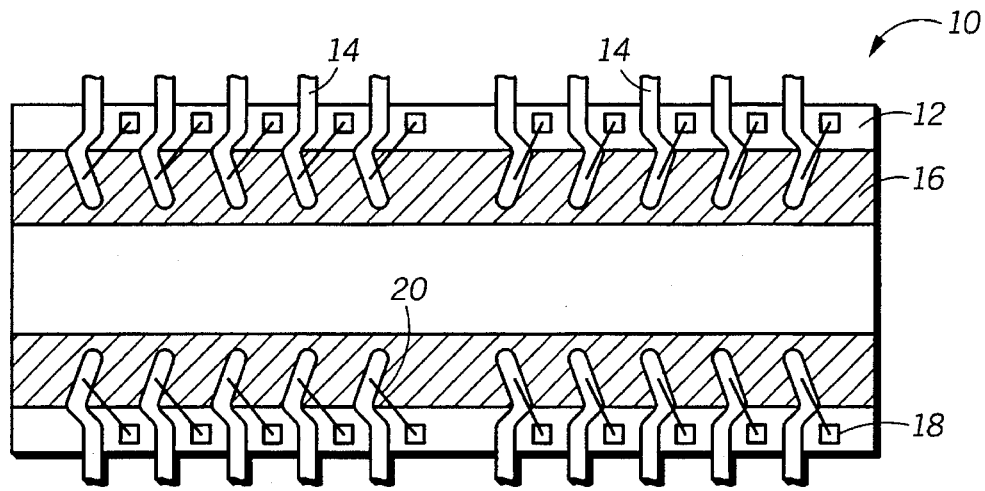
FIG. 1 illustrates, in a top view, a conventional lead-on-chip (LOC) device as known in the prior art.

The invention provides in one embodiment an LOC device having a comb-shape tape as the means of attachment for the leads to the die surface. The comb-shape tape has cut-outs between the leads to minimize the amount of tape between the leads. By minimizing the tape to die interface between the leads, the chance of voids forming between the leads is eliminated.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated. As many of the same elements are illustrated in more than one figure, like reference numerals are used to refer to elements having the same or substantially similar characteristics.

Figure 2:
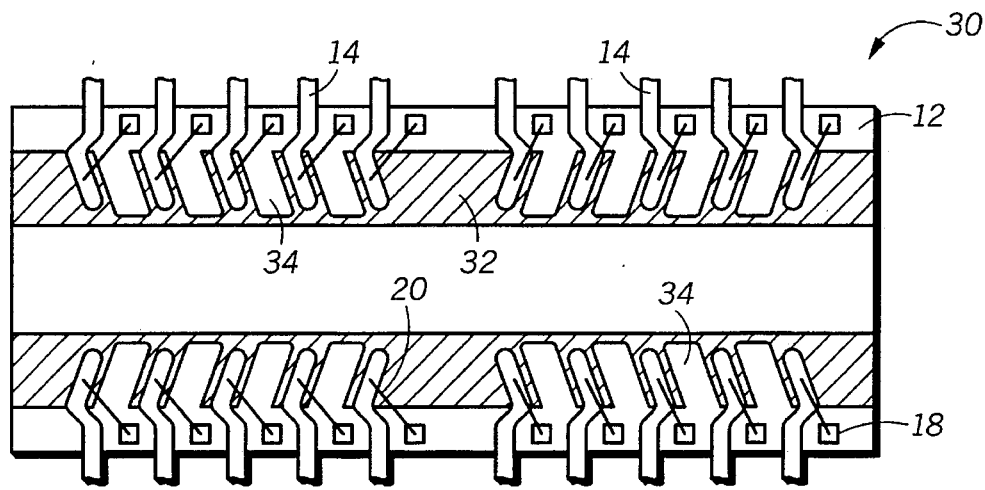
FIG. 2 illustrates, in a top view, an LOC device having a comb-shaped tape, in a first embodiment of the invention.

As illustrated in FIG. 2, a semiconductor device 30 offers an improvement over the prior art device previously shown in FIG. 1. The device 30 comprises the semiconductor die 12 having bonding pads 18 on its active surface. The bonding pads 18 are illustrated to be peripheral bonding pads, but it is understood that a die having center bonding pads may also be used in this embodiment of the present invention. Additionally, staggered bonding pads can also be used. Only a portion of the leads 14 are shown for ease of illustration. It is understood that the leads 14 extend outwardly to the rest of the leadframe (not shown). Furthermore, the particular configuration of the leads is not limited to that shown because leadframe designs and lead lay-out can vary significantly for the different types of semiconductor devices.

As shown in FIG. 2, a comb-shaped LOC tape 32 is used to attach the leads 14 to the die surface. The tape 32 is an electrically insulative tape. Suitable tape materials include thermoplastics as well as thermosets, such as polyimide, having an adhesive coating on both top and bottom surfaces of the tape. The comb-shaped tape 32 has "teeth" that closely match the contours of the leads such that gaps are provided between the leads. The actual die surface between the leads is exposed as opposed to the prior art configuration where the solid piece of tape completely covers the die surface underneath the leads. An advantage to the present invention is that the gaps 34 in the tape 32 allow air to escape between the leads during the tape application to eliminate the voiding problem. The elimination of the voids solves the two problems encountered in the prior art device, namely moisture entrapment leading to corrosion and delamination.

After the tape 32 has been applied and the leads 14 are attached to the surface of die 12, the leads may be conventionally wire bonded to the bonding pads on the die to electrically connect the leads by way of the wire bonds 20. Methods of wire bonding are known in the art. Essentially, all conventional assembly processing steps may be used to complete the packaging of the device.

Figure 3:
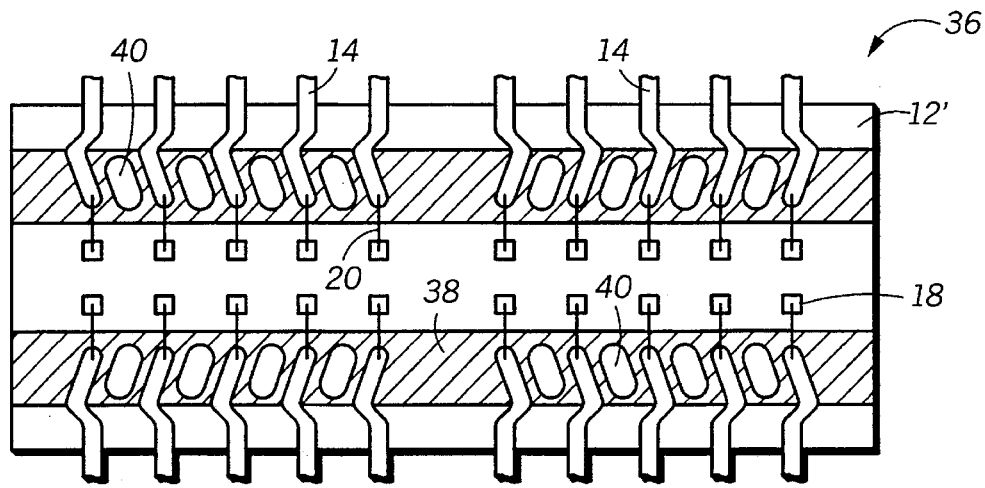
FIG. 3 illustrates, in a top view, an LOC device having a cut-out tape, in a second embodiment of the invention.

FIG. 3 illustrates, in a top view, an alternative embodiment of the invention. Device 36 comprises a semiconductor die 12' having center bonding pads as opposed to peripheral bonding pads to illustrate this second application of the present invention. Again it should be understood that peripheral bonding pads or staggered bonding pads may also be used. In this embodiment, the LOC tape 38 has cut-outs 40 located between the leads 14 as opposed to being comb-shaped. The purpose of the cut-outs is the same as that of the previous embodiment, in that the interface between the tape and the die surface is minimized in the areas between the leads. Thus, it is desirable to make the cut-outs 40 to be as large as possible given the spacing between the leads. This spacing varies with different leadframes but a typical design has a lead pitch ranging from 31.50 mils to 50 mils (0.8 mm to 1.3 mm); and given a typical lead width of 17 mils to 32 mils (0.4 mm to 0.8 mm), the spacing is expected to range from 20 mils to 40 mils (0.5 mm to 1 mm). It should be understood that these ranges are intended to give expected values but are in no way limiting to the invention. Furthermore, the particular shape of the cut-outs 40 is not limited to any particular shape, although an oblong shape is preferred because it allows a maximum removal of tape material between the leads without creating any stress points. This second embodiment has the same advantages as the previous embodiment: reduction in voids leading to greater device reliability by minimizing moisture entrapment and delamination. Furthermore, this embodiment may have another advantage in that the tape may be sturdier than the comb-shaped tape due to the more rigid nature of the tape design. This embodiment more closely approximates the solid tape 16 of the prior art while still providing the advantage of no tape between the leads.

Another advantage to both embodiments of the present invention is that the leadframe supplier or manufacturer can pre-apply the tape to the leadframes prior to shipping the LOC leadframes to the semiconductor device assembly location. This pre-application by the supplier allows more precise alignment between the tape and leads, which is important for the present invention because the presence of tape at the locations of the leads is required to prevent the leads from directly contacting the die surface. At the same time, a minimum amount of tape is desired between the leads to solve the voiding problem.

Figure 4:
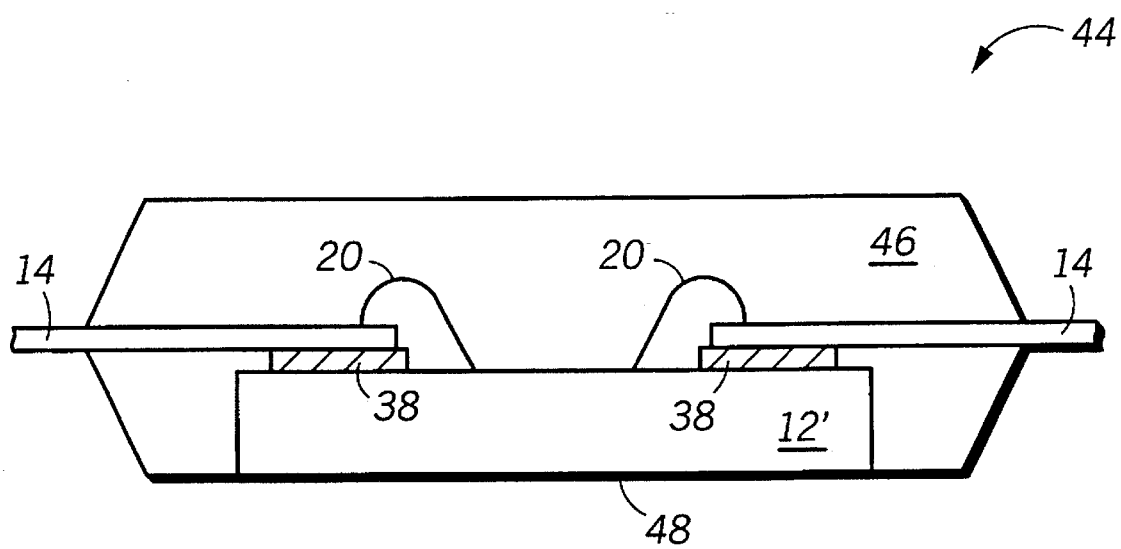
FIG. 4 illustrates, in cross-section, an encapsulated LOC device of FIG. 3.

FIG. 4 simply illustrates, in cross-section, an encapsulated LOC semiconductor device 44. As shown, the device 44 is a cross-section of the device of FIG. 3. A package body 46 has been formed to protect the die 12' and the wire bonds 20. The package body 46 may be formed from any number of encapsulating materials, such as thermosetting epoxy resin molding compounds or thermoplastic materials. The package body 46 exposes the backside or inactive surface of the die 12' for enhanced thermal dissipation. Additionally, this allows a thinner package body to be formed. However, complete encapsulation of the die is possible if desired for greater protection of the die. The external configuration of the leads may be formed into any desired configuration, such as gull-wing or J-leaded.

The foregoing description and illustrations contained herein demonstrate many of the advantages associated with the present invention. In particular, it has been revealed that a comb-shaped or cut-out LOC tape may be used in a lead-on-chip semiconductor device to reduce the voiding problem. The reduction of tape material between the leads allows air to escape during tape application so that voids are not formed between the die surface and the tape in those areas. Since the voids are no longer present, there is little chance for moisture entrapment. Hence, device reliability is increased.

Thus it is apparent that there has been provided, in accordance with the invention, an LOC semiconductor device that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the tape can be limited to a portion of the bottom surface of each lead so that there is no tape at all between the leads. Instead, only a small amount of tape will be pre-applied to the bottom surface of each lead. In addition, although the invention is most suited for memory dice which are typically packaged in small-outline packages (SOJs and TSOPs), the invention is not limited to these package types, but may also be used in quad-package configurations where applicable. Furthermore, the invention is in no way limited to any particular external lead configuration, such as J-leaded and gull-wing leaded. Therefore, it is intended that this invention encompasses all such variations and modifications falling within the scope of the appended claims.

We claim:

1. A lead-on-chip (LOC) semiconductor device, comprising:

a semiconductor die having a plurality of bonding pads on an active surface;

a plurality of leads overlying the active surface of the semiconductor die;

an electrically insulative adhesive tape between the semiconductor die and the plurality of leads to affix the plurality of leads to the active surface of the die, wherein the adhesive tape is disposed only in an area corresponding to the plurality of leads such that no adhesive tape is disposed between each of the plurality of leads; and a plurality of wire bonds connecting the plurality of leads to the plurality of bonding pads.

2. The device of claim 1, wherein the semiconductor die is a memory device having peripheral bonding pads.

3. The device of claim 1, wherein the semiconductor die is a memory device having center bonding pads.

4. The device of claim 1, wherein the electrically insulative adhesive tape is composed of a material selected from a group consisting of a thermoset and a thermoplastic.

5. The device of claim 1, further comprising a package body encapsulating the active surface of the semiconductor die and the plurality of wire bonds.

6. A lead-on-chip (LOC) semiconductor device, comprising:

a semiconductor die having a plurality of bonding pads on an active surface;

a plurality of leads overlying the active surface of the semiconductor die;

an integral piece of electrically insulative adhesive tape having cut-outs between two continuous edges of the integral piece of tape, the integral piece of tape being disposed between the semiconductor die and the plurality of leads to affix the plurality of leads to the active surface of the die, the cut-outs being located between each of the plurality of leads; and a plurality of wire bonds connecting the plurality of leads to the plurality of bonding pads.

7. The device of claim 6, wherein the semiconductor die is a memory device having peripheral bonding pads.

8. The device of claim 6, wherein the semiconductor die is a memory device having center bonding pads.

9. The device of claim 6, wherein the cut-outs in the integral piece of electrically insulative adhesive tape are characterized as having an oblong shape.

10. The device of claim 6, wherein the integral piece of electrically insulative adhesive tape is composed a material selected from a group consisting of a thermoset and a thermoplastic.

11. The device of claim 6, further comprising a package body encapsulating the active surface of the semiconductor die and the plurality of wire bonds.

12. A method for making a lead-on-chip (LOC) semiconductor device, comprising:

providing a semiconductor die having a plurality of bonding pads on an active surface;

providing an electrically insulative adhesive tape;

attaching a plurality of leads to the active surface of the semiconductor die using the adhesive tape, wherein the adhesive tape is shaped to match the plurality of leads such that upon attaching the plurality of leads the active surface between adjacent leads remains exposed, without there being any adhesive tape exposed between adjacent leads;

wire bonding the plurality of leads to the plurality of bonding pads to form a plurality of wire bonds electrically connecting the semiconductor die to the plurality of leads; and encapsulating the active surface of the semiconductor die and the plurality of wire bonds to protect the device.

13. The method of claim 12, wherein the step of providing the semiconductor die comprises providing a memory device having peripheral bonding pads.

14. The method of claim 12, wherein the step of providing the semiconductor die comprises providing a memory device having center bonding pads.

* * * * *